(12) United States Patent
Noda

(10) Patent No.: US 12,098,818 B2
(45) Date of Patent: Sep. 24, 2024

(54) LIGHT EMITTING EMBLEM

(71) Applicant: TOYODA GOSEI CO., LTD., Kiyosu (JP)

(72) Inventor: Yoshihide Noda, Aichi-ken (JP)

(73) Assignee: TOYODA GOSEI CO., LTD., Aichi-pref. (JP)

(*) Notice: Subject to any disclaimer, the term of this patent is extended or adjusted under 35 U.S.C. 154(b) by 0 days.

(21) Appl. No.: 18/302,124

(22) Filed: Apr. 18, 2023

(65) Prior Publication Data

US 2023/0349532 A1 Nov. 2, 2023

(30) Foreign Application Priority Data

Apr. 28, 2022 (JP) .................................. 2022-075387

(51) Int. Cl.
 *F21S 43/241* (2018.01)
 *F21S 43/14* (2018.01)
 *H01L 25/075* (2006.01)
(52) U.S. Cl.
 CPC ............. *F21S 43/241* (2018.01); *F21S 43/14* (2018.01); *H01L 25/0753* (2013.01)
(58) Field of Classification Search
 CPC ....... B60R 13/005; F21S 43/50; F21S 43/241; F21S 43/14; F21S 43/15
 See application file for complete search history.

(56) References Cited

U.S. PATENT DOCUMENTS

2017/0036594 A1\* 2/2017 Roberts .................. F21S 45/50
2023/0204173 A1\* 6/2023 Chapman-Winter ... F21S 41/32
362/511

FOREIGN PATENT DOCUMENTS

JP 6101537 B2 3/2017

\* cited by examiner

*Primary Examiner* — Eric T Eide
(74) *Attorney, Agent, or Firm* — Posz Law Group, PLC

(57) ABSTRACT

A light emitting emblem includes: a light emitting element as a light source; a housing configured to house the light emitting element; and a cover including an emblem on a surface thereof, including a light transmitting portion as defined herein, and attached to the housing to cover the light emitting element, at least a part of an outer surface of the light transmitting portion is exposed to an outside as a light emitting region of the cover, an inner surface of the light transmitting portion includes a bent portion being a boundary line between a plane and a plane different in orientation, and all low-lightness lines, which are linear low-brightness regions appearing on a surface other than the inner surface of the light transmitting portion due to a factor including refraction of light incident on the bent portion, appear in a region other than the light emitting region.

9 Claims, 4 Drawing Sheets

LIGHT EMITTING EMBLEM

CROSS-REFERENCE TO RELATED APPLICATION

This application is based on and claims priority under 35 USC 119 from Japanese Patent Application No. 2022-075387 filed on Apr. 28, 2022.

TECHNICAL FIELD

The present invention relates to a light emitting emblem, and more particularly to a light emitting emblem to be provided to a vehicle such as an automobile.

BACKGROUND ART

Conventionally, a vehicle emblem having a light emitting function has been known (see JP6101537B). In the emblem described in JP6101537B, a plurality of LEDs serving as a light source are housed in a case, and light emitted from the LED is guided by a light guide and emitted, whereby the emblem emits light.

SUMMARY OF INVENTION

However, as in the emblem described in JP6101537B, when a bent portion, which is a boundary line between a plane and a plane that are different in orientation, is present on an inner surface of the light guide, a low-lightness line, which is a linear low-lightness region, appears on an outer surface of the light guide from which light is extracted, due to refraction of light incident on the bent portion of the inner surface. When the low-lightness line located at a position visually recognized from the outside of the emblem, luminance unevenness may occur in the light emission of the emblem, which may adversely affect the appearance.

An object of the present invention is to provide a light emitting emblem in which luminance unevenness of light emission caused by a bent portion of an inner surface of a light guide provided in a cover is prevented.

In order to achieve the above object, an aspect of the present invention provides a light emitting emblem according to the following (1) to (6).

(1) A light emitting emblem including: a light emitting element as a light source; a housing configured to house the light emitting element; and a cover including an emblem on a surface of the cover, including a light transmitting portion made from a light guide configured to extract light emitted from the light emitting element, and attached to the housing in a manner of covering the light emitting element, in which at least a part of an outer surface of the light transmitting portion is exposed to an outside as a light emitting region of the cover, an inner surface of the light transmitting portion includes a bent portion which is a boundary line between a plane and a plane different orientation, and a low-lightness lines, which are linear low-brightness regions appearing on a surface other than the inner surface of the light transmitting portion due to a factor including refraction of light incident on the bent portion, appear in a region other than the light emitting region.

(2) The light iii emblem according to (1), in which the light transmitting portion includes a first flat plate portion whose outer surface is included in the light emitting region, and a second flat plate portion which bends and extends from the first flat plate portion toward the housing and at least a part of an outer surface of which is not included in the light emitting region, and the low-lightness line due to a factor including refraction of light incident on a boundary line between an inner surface of the first flat plate portion and an inner surface of the second flat plate portion as the bent portion appears in a region, which is not included in the light emitting region, of the outer surface of the second flat plate portion.

(3) The light emitting emblem according to (2), in which a thickness of the first flat piece portion is twice or more a thickness of the second flat plate portion.

(4) The light emitting emblem according to (2), in which a thickness of the second flat plate portion is 0.5 mm or more.

(5) The light emitting emblem according to (2), in which a width of the outer surface of the second flat plate portion is 3 mm or more.

(6) The light emitting emblem according to any one of (1) to (5), in which the light transmitting portion includes a diffusion material configured to diffuse light, emitted from the light emitting element.

According to the present invention, it is possible to provide a light emitting emblem in which luminance unevenness of light emission caused by a bent portion of an inner surface of a light guide provided in a cover is prevented.

DETAILED DESCRIPTION OF THE INVENTION (Configuration of Light Emitting Emblem)

Figure 1A:
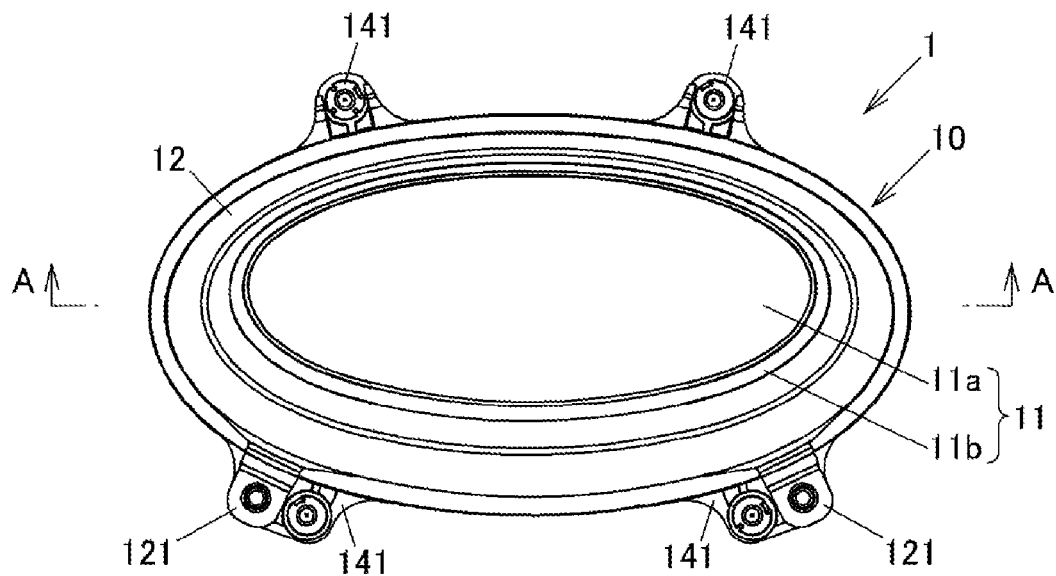
FIG. 1A is a front view of a light emitting emblem according to an embodiment of the present invention.
Figure 1B:
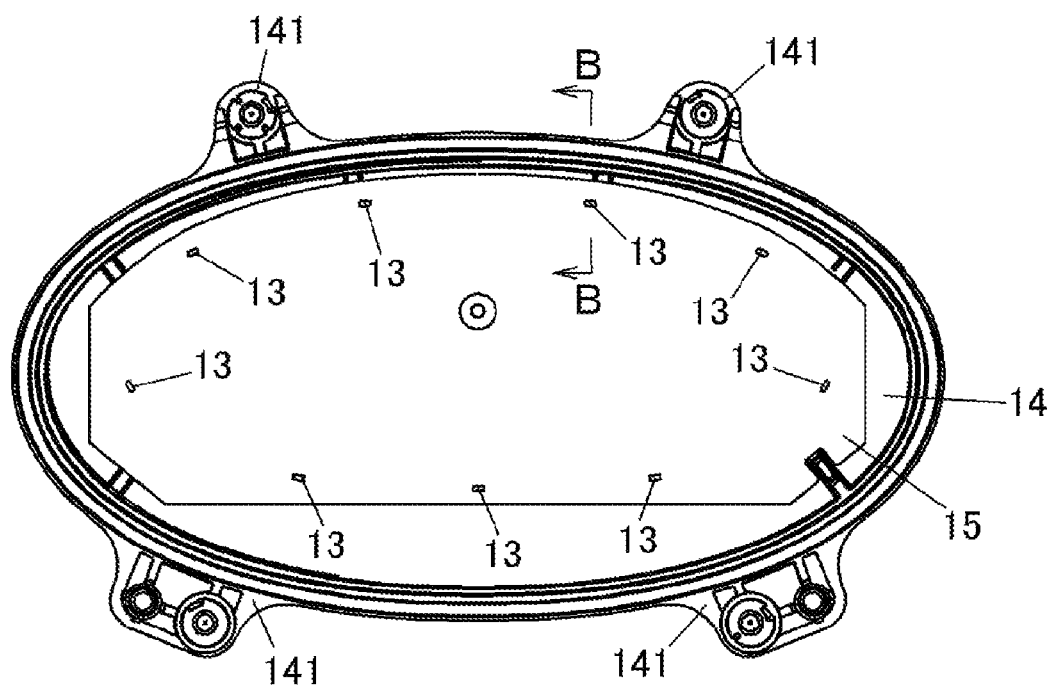
FIG. 1b is a front view of the light emitting emblem in a state where a cover is removed.
Figure 2A:
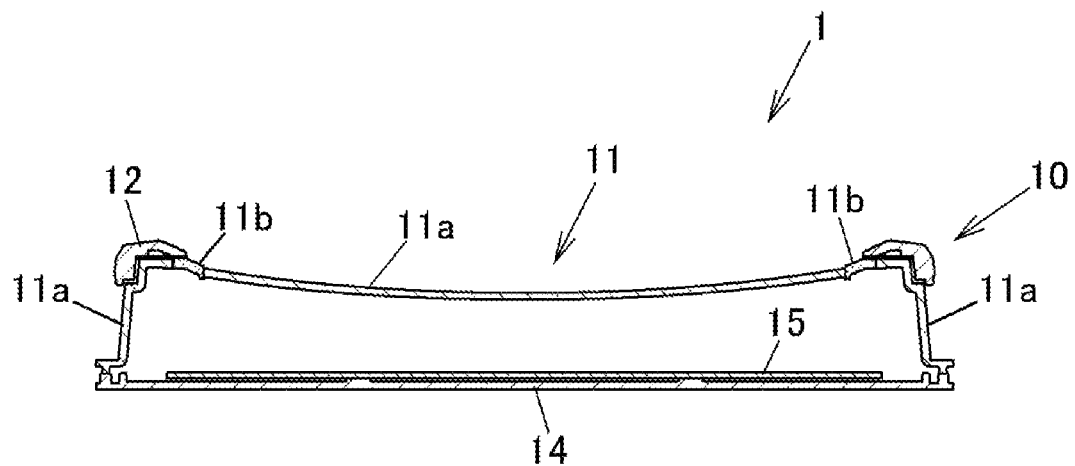
FIG. 2A is a vertical cross-sectional view of the light emitting emblem cut along a cutting line A-A shown in FIG. 1A.
Figure 2B:
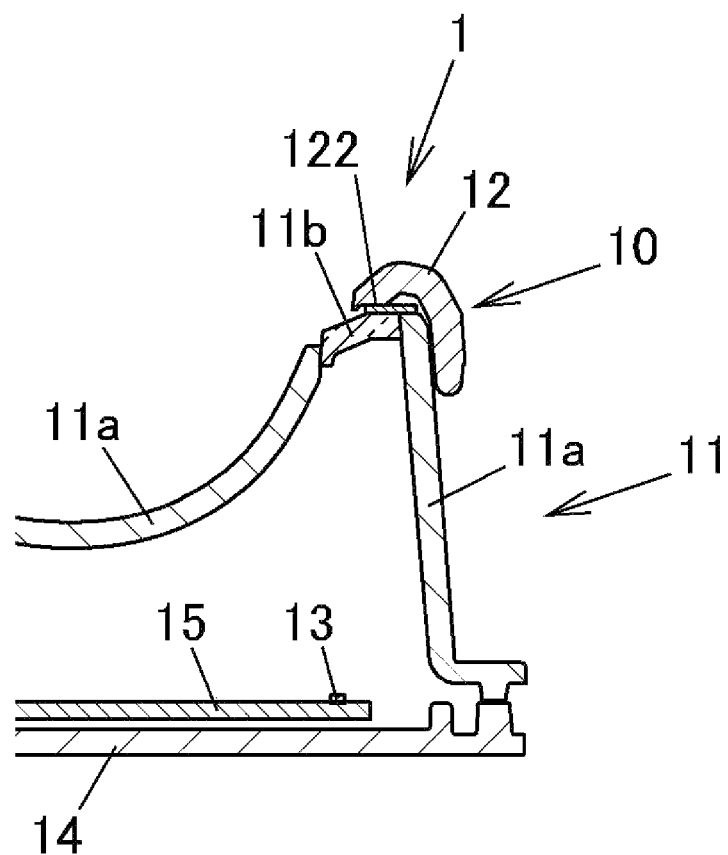
FIG. 2B is a partial vertical cross-sectional view of the light emitting emblem cut along a cutting line B-B shown in FIG. 1B.

FIG. 1A is a front view of a light emitting emblem 1 according to an embodiment of the present invention. FIG. 1B is a front view of the light emitting emblem 1 in a state wherein a cover 10 is removed. FIG. 2A is a vertical cross-sectional view of the light emitting emblem 1 cut along a cutting line A-A shown in FIG. 1A. FIG. 2B is a partial vertical cross-sectional view of the light emit emblem 1 cut along a cutting line B-B shown in FIG. 1B.

The light emitting emblem 1 includes a light emitting element 13 as a light source, a housing 14 that houses the light emitting element 13, and a cover 10 including an emblem 12 on a surface of the cover 10, including a light transmitting portion 11b made from a light guide for extracting light emitted from the light emitting element 13, and attached to the housing 14 in a manner of covering the light emitting element 13.

The light emitting element 13 is a light emitting element mounted on a printed circuit board 15, and typically an LED is used. The printed circuit board 15 is fixed to the housing 14 such that a surface on which the light emitting element 13 is mounted faces the cover 10, for example. In order to increase light refraction efficiency by increasing the light reflectance of the surface of the printed circuit board 15, the printed circuit board 15 is preferably a white board in which FR-4, CEM3, or the like is used as a base material, or a board in which a portion of the surface exposed in an exposure hole 153 is painted in white.

The 14 is formed of, for example, acrylonitrile-styrene-acrylate (ASA). The housing 14 includes a fixing portion 141 to fix the housing 14 to an attachment target of the light emitting emblem 1 such as a front grille of a vehicle. The housing 14 can be fixed ho the attachment target of the light emitting emblem 1, for example, by tightening a screw through a screw fastening hole formed in the fixing portion 141.

The cover 10 includes a non-light transmitting portion 11a that does not transmit light emitted by the light emitting element 13, a cover body 11 that includes the light transmitting portion 11b through which light emitted by the light emitting element 13 passes, and the emblem 12 that is provided on a surface of the cover body 11. The non-light transmitting portion 11a and the light transmitting portion 11b that constitute the cover body 11 may be integrally molded or may be separate and typically, are in molded by two-color molding.

The non-light transmitting portion 11a is formed of, for example, resin such as ASA. In order not to transmit light, the non-lightly transmitting portion 11a may be formed by, for example, molding resin colored in black or the like, or a surface of the non-light transmitting portion 11a may be coated or plated.

The light transmitting portion 11b, which is a light guide, is formed of, for example, resin such as methyl methacrylate (PMMA) or polycarbonate (PC) that transmits light emitted from the light emitting element 13. The light transmitting portion 11b preferably contains a diffusion material such as $TiO_2$ particles in order to improve the uniformity of extracted light. A lens cut may be provided on an inner surface of the light transmitting portion 11b, that is, on a surface on a light emitting element 13 side.

As shown in FIGS. 2A and 2B, a part of an outer surface of the light transmitting portion 11b is exposed to the outside, and functions as a light emitting region of the cover 10. Thus, light emitted from the light emitting element 13 and taken into the light transmitting portion 11b is extracted to the outside from the exposed part. In examples shown in FIGS. 1A, 1B, 2A, and 2B, the light transmitting portion 11b and the exposed part thereof are provided along an inner contour of the emblem 12. When the light emitting element 13 is turned on, the light emitting element 13 emits light along the inner contour of the emblem 12.

In order for the light transmitting portion 11b to efficiently take emitted from the light emitting element, as shown in FIGS. 1A and 1B, a plurality of the light emitting elements 13 are preferably located directly below the light transmitting portion 11b along a planar shape of the light transmitting portion 11b.

The emblem 12 is formed of, for example, resin such as acrylonitrile-butadiene-styrene (ABS), and a surface of the emblem 12 is plated. The emblem 12 includes a fixing portion 121 that fixes the emblem 12 to an attachment target of the light emitting emblem 1 such as a front grille of a vehicle. For example, the emblem 12 can be fixed to the attachment target of the light emitting emblem 1 by tightening a screw through a screw fastening hole formed in the fixing portion 121. As shown in FIG. 2B, the emblem 12 may be fixed to the cover body 11 by a double-sided tape 122.

In the cover 10, the emblem is expressed using the emblem 12 which is a dedicated component. However, a method for expressing the emblem is not limited thereto, and for example, a part of the light transmitting portion 11b serving as a light emitting region and a part of the non-light transmitting portion 11a may be used for expression of the emblem. Thus, a method for applying the emblem to the cover 10 is not limited, (Shape of Light Transmitting Portion)

Figure 3A:
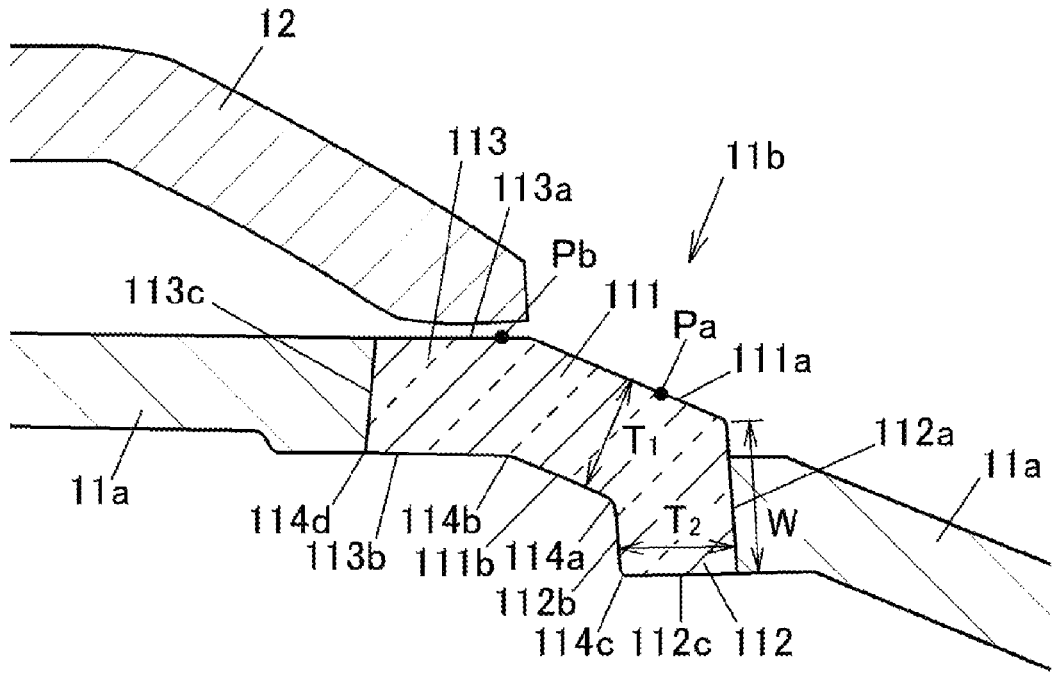
FIGS. 3A and 3B are enlarged vertical cross-sectional views of a light transmitting portion of the cover and a periphery thereof.
Figure 3B:
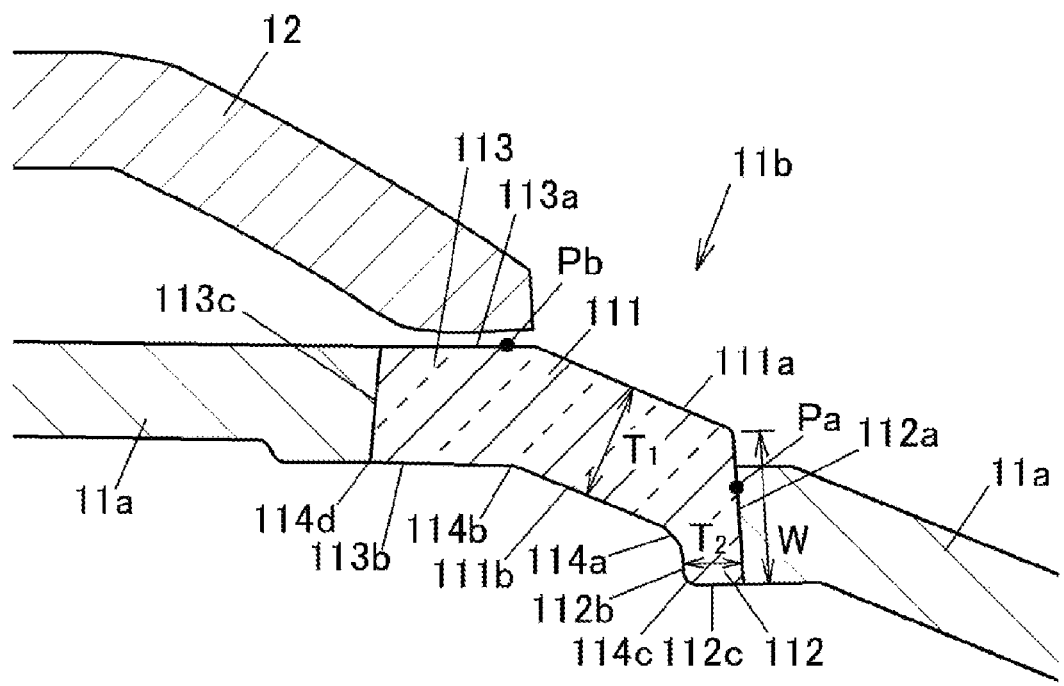
Figure 4A:
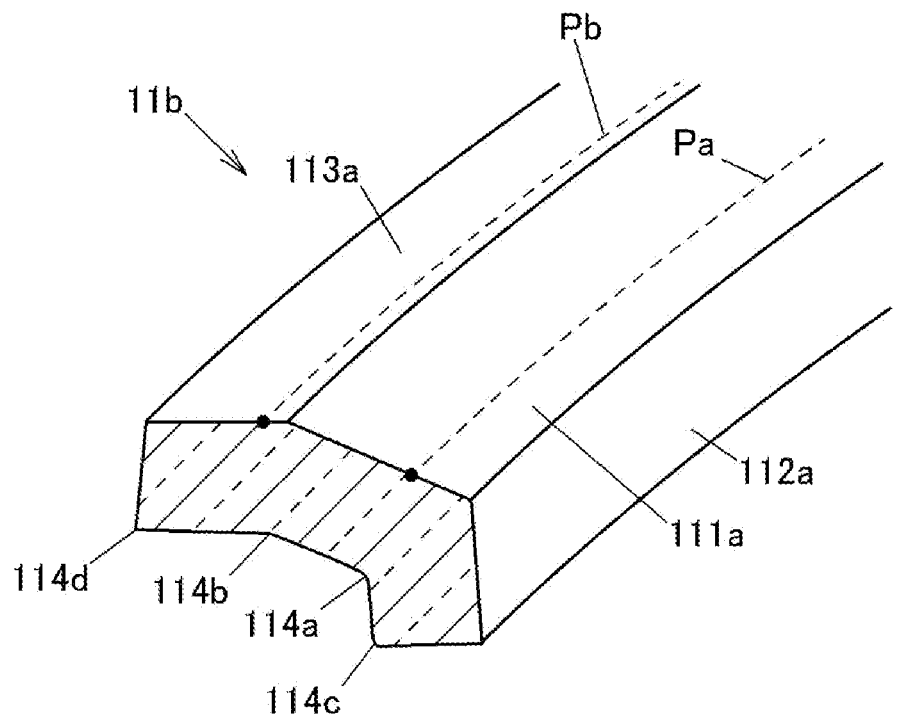
FIGS. 4A and 4B are perspective views of a part of the light transmitting portion including a cross section shown in FIGS. 3A and 3B, respectively.
Figure 4B:
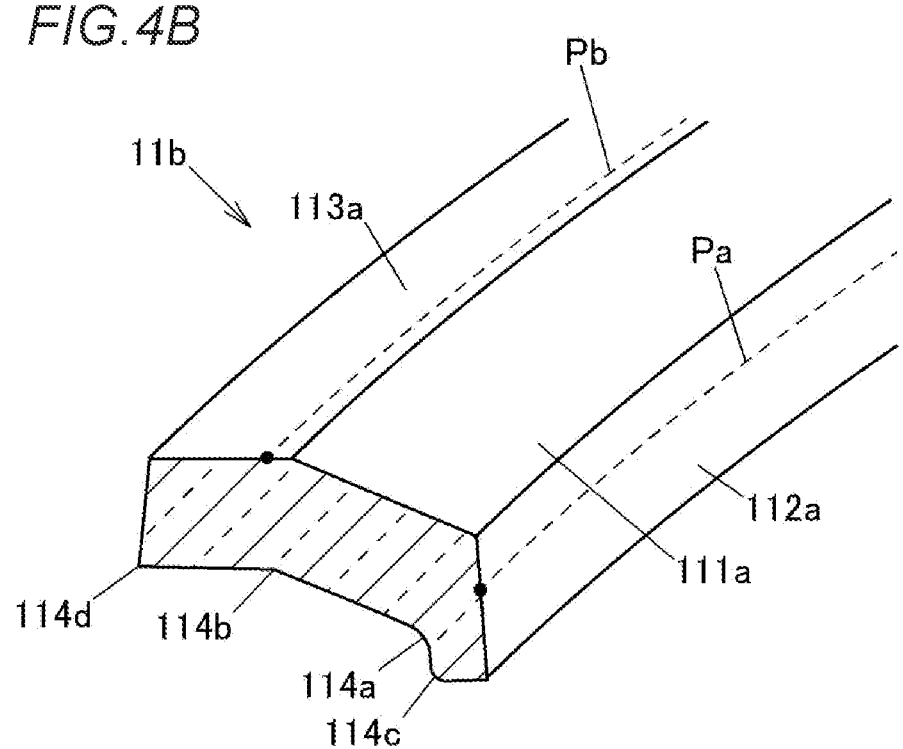

FIGS. 3A and 3B are enlarged vertical cross-sectional views of the light transmitting portion 11b of the cover 10 and a periphery thereof. In FIGS. 3A and 3B, a thickness $T_2$ of a second flat plate portion 112 to be described later is different. FIGS. 4A and 4B are perspective views of a part of the light transmitting portion 11b including a cross section shown FIGS. 3A and 3B, respectively.

The light transmitting portion 11b includes a first flat plate portion 111 inclined with respect to a planar direction of the light emitting emblem 1, the second flat plate portion 112 that is located inside the first flat plate portion 111 in the planar direction and that bends and extends from the first flat plate portion 111 toward the housing 14, and a third flat plate portion 113 that is located outside the first flat plate portion 111 in the planar direction and that bends and extends from the first flat plate portion 111 along the planar direction of the light emitting emblem 1. The second flat plate portion 112 has an inclination that is closer to perpendicular to the planar direction of the light emitting emblem 1 than s the first flat plate portion 111, and the third flat plate portion 113 has an inclination that is closer to parallel to the planar direction of the light emitting emblem 1 than is the first flat plate portion 111.

The first flat plate portion 1, the second flat plate portion 112, and the third flat plate portion 113 are integrally molded from the same material, and are continuous without an interface. The first flat plate portion 111, the second flat plate portion 112, and the third flat plate portion 113 are annular flat plate-shaped members. The non-light transmitting portion 11a is joined to an outer surface 112a of the second flat plate portion 112 and an end surface 113c, in the planar direction, of the third flat plate portion 113.

An outer surface 111a of the first flat plate portion 111 is exposed to the outside, and is included in the light emitting region of the cover 10. All regions of the surface 111a may be exposed to the outside. At least a lower part of the outer surface 112a of the second flat plate portion 112, that is, a part of the outer surface 111a on a housing 14 side is covered with the nonlight transmitting portion 11a, and a part not covered with the non-light transmitting portion 11a is included in the light emitting region, but the part covered with the non-light transmitting portion 11a is not included in the light emitting region. Almost all parts of an outer surface 113d of the third flat plate portion 13 are covered with the emblem 12, and are not included in the light emitting region.

The first flat pate-portion 111 and the second flat plate proton 111b are continuous, and a boundary line between an inner surface 111 of the first flat plate portion 111 and an inner surface 112b of the second flat plate portion 112 that have different orientations forms a bent portion 114a. The first flat plate portion 111 and the third flat plate portion 113 are continuous, and a boundary line between the inner surface 111b of the first flat plate portion 111 and an inner surface 113b of the third flat plate portion 113 that have different orientations forms a bent portion 114b.

Here, inner sides and outer sides of the first flat plate portion 111, the second flat plate portion 112, and the third flat plate portion 113 mean inner sides and outer sides of a space surrounded by the housing 14 in which the light emitting element 13 is provided and the cover 10. Thus, the inner sides of the first flat plate portion 111, the second flat plate portion 112, and the third flat plate portion 113 are sides that mainly take in light emitted from the light emitting element 13, and the outer sides are space sides outside the light emitting emblem 1 that emits light.

If a bent portion is present, which is a boundary line between a plane and a plane that are different in orientation in the surface of the light transmitting portion 11b, such as the bent portion 114a or the bent portion 114b, a low-lightness line, which is a linear low-lightness region, appears on a surface other than the inner surface of the light transmitting portion 11b due to factors including refraction of light emitted from the light emitting element 13 and incident on the bent portion, specifically, factors including refraction of light incident on the bent portion, scattering of light at the bent portion in the light transmitting portion 11b, and deviation of dispersion of a diffusion material when the light transmitting portion 11b contains the diffusion material. A position where the low-lightness line appears is affected by a refractive index of the light transmitting portion 11b and how the dispersion of the diffusion material deviates when the light transmitting portion 11b contains the diffusion material, and the like.

For example, in an example shown in FIG. 3A, the low lightness line appears at a position Pa on the outer surface 111a of the first flat plate portion 111 and a position Pb on the outer surface of the third flat plate portion. 113 due to factors including refraction of light incident on the bent portion 114a and the bent portion 114b. At this time, the low-lightness line due to the factors including refraction of light incident on the bent portion 114a is visually recognized from the outside because the low-lightness line appears on the outer surface 111a included in the light emitting region. However, since the position Pb is covered with the emblem 12, the position Pb is not exposed to the outside and is not in the light emitting region. Therefore, the low-lightness line due to the factors including refraction of light incident on the bent portion 114b is not visually recognized from the outside.

The low-lightness line appears in a case where a bending angle of the bent portion, that is, an angle formed by a plane and a plane having the bent portion as the boundary line is not in a range of 90°±10° and 270°±10, that is, in a case where the angle is in a range of 0° or more and 80° or less, in a range of 100° or more and 260° or less, or in a range of 280° or more and 360° or less.

In the light transmitting portion 11b, the boundary line between the inner surface 112b of the second flat plate portion 112 and the end surface 112c of the second flat plate portion 112 forms the bent portion 114c, and the boundary line be ween the inner surface 113b of the third flat plate portion. 113 and the end surface 113c of the third flat plate portion 113 forms the bent portion 114d. However, since bending angles of the bent portions 114c and 114d are within the range of 270°±10°, no low-lightness lines appear due to the factors including refraction of light incident on the bent portions 114c and 114d.

The position Pa where the low-lightness line due to the factor including refraction of light incident on the bent portion 114a appears changes depending on a ratio between a thickness $T_1$ of the first flat plate portion 111 and the thickness $T_2$ of the second flat plate portion 112.

When the thickness $T_1$ of the first flat plate portion 111 is less than twice the thickness $T_2$ of the second flat plate portion 112 ($T_1/T_2<2$), the low-lightness line due to the factors including refraction of light incident on the bent portion 114a appears on the outer surface 111a of the first flat plate portion 111 included in the light emitting region as shown in FIG. 3A. In this case, as $T_1/T_2$ is closer to 2, the position Pa becomes closer to a boundary between the surface 111a and the surface 112a.

When the thickness $T_1$ of the first flat plate portion 111 is twice or more the thickness $T_2$ of the second flat plate portion 112 ($2 \leq T_1/T_2$), the low-lightness line due to the factors including refraction of light incident on the bent portion 114a appears on the outer surface 112a of the second flat plate portion 112 as shown in FIG. 3B. Since the non-light transmitting portion 11a is joined to the surface 12a, the part of the outer surface 112a where the lightness line appears can be covered with the non-right transmitting portion 11a so as to be placed outside the light emitting region.

As described above, in the light transmitting portion. 11b in which the thickness $T_1$ of the first flat plate portion 111 is twice or more the thickness $T_2$ of the second flat plate portion 112, all low-lightness lines due to the factors including refraction of light incident on the bent portion in the inner surface can be generated a region other than the light emitting region. Accordingly, all the low-lightness are not visually recognized from the outside, and luminance unevenness of light emission of the light emitting emblem 1 is prevented.

The typical thickness $T_1$ of the first plate portion 111 is, for example, 3.0 mm. In this case, when the light transmitting portion 11b contains the diffusion material and the thickness $T_2$ of the second flat plate portion 112 is 3.0 mm, the low-lightness line due to the factors including refraction of light incident on the bent portion 114a appears at a position 1.5 mm from the boundary line with the or surface 112a of the second flat plate portion 112 in the planar direction. The position is on the outer surface 111a of the first flat plate portion 111. Further, when the thickness $T_2$ of the second flat plate portion 112 is 1.5 mm or less, the low-lightness line due to the factors including refraction of light incident on the bent portion 114a appears on the outer surface 112a of the second flat plate portion 112.

When the thickness $T_2$ of the second flat plate portion 112 is less than 0.5 mm, a groove of a mold used for molding the light transmitting portion 11b may be too narrow to allow resin to be poured properly. Therefore, the thickness $T_2$ of the second flat plate portion 112 is preferably 0.5 mm or more. Therefore, when the thickness $T_1$ of the first flat plate portion 111 is 3.0 mm, it can be said that the thickness of the first flat plate portion 111 is 6 times or less ($T_1/T_2 \leq 6$) the thickness $T_2$ of the second flat plate portion 112.

When the non-light transmitting portion 11a and the light transmitting portion 11b are integrally molded by two-color molding, a width of a joining portion between the non-light transmitting portion 11a outside the light transmitting portion 11b and the light transmitting portion 11b is easily secured by providing, in the light transmitting portion 11b, the second flat plate portion 112 bending and extending from the first flat plate portion 111 toward the housing 14. In order to secure a strength of the joining portion between the non light transmitting portion 11a and the light transmitting portion 11b, the width of the joining portion is required to be 3 mm or more. Therefore, a width W of the outer surface 112a of the second flat plate portion 112 is preferably 3 mm or more.

It has been confirmed that, when the light transmitting portion 11b contains a diffusion material that diffuses light emitted from the light emitting element 13, the position where the low-lightness line due to the factors including refraction of light incident on the bent portion in the inner surface of the light transmitting portion 11b does not depend on the angle at which light transmitting portion 11b takes in light from the inner side, that is, the position does not depend on a positional relationship between the light transmitting portion 11b and the light emitting element 13 in the planar direction.

When the light transmitting portion 11b does contain a diffusion material, the position where the low-lightness line appears depends on. The positional relationship between the light transmitting portion 11b and the light emitting element 13 in the planar direction. However, in this case, the position. Where the low-lightness line appears can also be controlled according to the ratio between the thickness $T_1$ of the first flat plate portion 111 and the thickness $T_2$ of the second flat plate portion 112, and can also be placed at a position not in the light emitting region.

Effects of Embodiment

According to the embodiment of the present invention described above, the light transmitting portion 11b made from the light guide is formed in such a shape that the low-lightness line due to the factors including refraction of light incident on the bent portion appears in the region other than the light emitting region, so that luminance unevenness of light emission of the emitting emblem 1 can be prevented.

Even in a case in which the shape of the light transmitting portion 11b is different from that described in the embodiment described above, when a bent portion that satisfies a condition of the bending angle described above is provided in the inner surface, the low-lightness line due to the factors including refraction of light incident on the bent portion appears on a surface other than the inner surface, as described in the embodiment described above, the position where the low-lightness line is generated can also be controlled by adjusting the ratio of the thicknesses of the flat plate portions constituting the light transmitting portion 11b, and can also be placed outside the light emitting region.

Although the embodiment of the present invention has been described above, the present invention is not limited to the embodiment described above, and various modifications can be made without departing from the gist of the in Constituent elements according to the embodiment described above can be freely combined without departing from the gist of the invention.

The embodiment described above does not limit the invention according to the scope of the claims. It should be noted that all combinations of features described in the embodiment are not necessarily essential to means for solving the problems of the invention.

REFERENCE SIGNS LIST

1: light emitting emblem
10: cover
11: cover body
11a: non-light transmitting portion
11b: light transmitting portion
12: emblem
13: light emitting element
14: housing
15: printed circuit board
111: first flat plate portion
111a: outer surface
111b: inner surface
112: second flat plate portion
112a: outer surface
112b: inner surface
112c: end surface
113: third flat plate portion
113a: outer surface
113b: inner surface
113c: end surface
114a to 114d: bent portion

The invention claimed is:

1. A light emitting emblem comprising:
a light emitting element as a light source;
a housing configured to house the light emitting element; and
a cover including an emblem on a surface of the cover, including a light transmitting portion made from a light guide configured to extract light emitted from the light emitting element, and attached to the housing to cover the light emitting element, wherein
at least a part of an outer surface of the light transmitting portion is exposed to an outside as a light emitting region of the cover,
an inner surface of the light transmitting portion includes a bent portion which is a boundary line between a plane and a plane different in orientation,
all low-lightness lines, which are linear low-brightness regions appearing on a surface other than the inner surface of the light transmitting portion due to a factor including refraction of light incident on the bent portion, appear in a region other than the light emitting region,
wherein the light transmitting portion includes a first flat plate portion whose outer surface is included in the light emitting region, and a second flat plate portion which bends and extends from the first flat plate portion toward the housing and at least a part of an outer surface of which is not included in the light emitting region, and
the low-lightness line due to a factor including refraction of light incident on a boundary line between an inner surface of the first flat plate portion and an inner surface of the second flat plate portion as the bent portion appears in a region, which is not included in the light emitting region, of the outer surface of the second flat plate portion.

2. The light emitting emblem according to claim 1, wherein a thickness of the first flat plate portion is twice or more a thickness of the second flat plate portion.

3. The light emitting emblem according to claim 1, wherein a thickness of the second flat plate portion is 0.5 mm or more.

4. The light emitting emblem according to claim 1, wherein a width of the outer surface of the second flat plate portion is 3 mm or more.

5. The light emitting emblem according to claim 1, wherein
the light transmitting portion includes a diffusion material configured to diffuse light emitted from the light emitting element.

6. The light emitting emblem according to claim 1, wherein the light transmitting portion includes a diffusion material configured to diffuse light emitted from the light emitting element.

7. The light emitting emblem according to claim 2, wherein
the light transmitting portion includes a diffusion material configured to diffuse light emitted from the light emitting element.

8. The light emitting emblem according to claim 3, wherein
the light transmitting portion includes a diffusion material configured to diffuse light emitted from the light emitting element.

9. The light emitting emblem according to claim 4, wherein
the light transmitting portion includes a diffusion material configured to diffuse light emitted from the light emitting element.

* * * * *